US012693314B1

(12) United States Patent
Lowe et al.

(10) Patent No.: US 12,693,314 B1
(45) Date of Patent: Jul. 28, 2026

(54) METHOD AND APPARATUS FOR SENSING CURRENT

(71) Applicant: XL Scientific, LLC, Albuquerque, NM (US)

(72) Inventors: Jacob L. Lowe, Albuquerque, NM (US); Matthew Domonkos, Albuquerque, NM (US); John J. Osowski, Los Lunas, NM (US)

(73) Assignee: XL Scientific, LLC, Albuquerque, NM (US)

( * ) Notice: Subject to any disclaimer, the term of this patent is extended or adjusted under 35 U.S.C. 154(b) by 201 days.

(21) Appl. No.: 18/658,905

(22) Filed: May 8, 2024

Related U.S. Application Data

(62) Division of application No. 17/968,156, filed on Oct. 18, 2022, now Pat. No. 12,123,898.

(60) Provisional application No. 63/256,919, filed on Oct. 18, 2021.

(51) Int. Cl.
    *G01R 15/18* (2006.01)
    *G01R 19/00* (2006.01)

(52) U.S. Cl.
    CPC ....... *G01R 15/181* (2013.01); *G01R 19/0092* (2013.01)

(58) Field of Classification Search
    CPC .......................... G01R 15/181; G01R 19/0092
    See application file for complete search history.

(56) References Cited

U.S. PATENT DOCUMENTS

| | | | | |
|---|---|---|---|---|
| 2003/0046013 A1* | 3/2003 | Gerrish | ............. | H01J 37/32935 |
| | | | | 702/60 |
| 2004/0027748 A1* | 2/2004 | Kojovic | .................. | H02H 3/28 |
| | | | | 361/62 |

| | | | | |
|---|---|---|---|---|
| 2006/0279910 A1 | 12/2006 | Gunn et al. | | |
| 2008/0060808 A1 | 3/2008 | Gibson | | |
| 2008/0174320 A1 | 7/2008 | Smith et al. | | |
| 2008/0211484 A1* | 9/2008 | Howell | ................ | G01R 15/181 |
| | | | | 336/229 |
| 2010/0301852 A1 | 12/2010 | Teppan et al. | | |

(Continued)

FOREIGN PATENT DOCUMENTS

| | | |
|---|---|---|
| JP | 2011038996 A | 2/2011 |
| JP | 4842166 B2 | 10/2011 |
| JP | 2020076707 A | 5/2020 |

OTHER PUBLICATIONS

"Fabrication of three-dimensional micro-Rogowski coil based on femtosecond laser micromachining", Appl. Phys. A, 2015, 669-674.

(Continued)

*Primary Examiner* — Lee E Rodak
*Assistant Examiner* — Zannatul Ferdous
(74) *Attorney, Agent, or Firm* — Peacock Law P.C.; Justin R. Jackson; Daniel Bergenger-Russell

(57) ABSTRACT

A method and apparatus for sending current. A flow of current can be passed through a portion of the sensor, such that the sensor forms part of the current flow circuit. The sensor can be especially useful in high vacuum environments and/or in areas where a small sensor is desired. In one embodiment, the current sensor can form part of a ground circuit and a leg of the sensor can comprise a leg of the drive circuit. A current sensing loop of the sensor can at least partially encircle a portion of the sensor itself such that the current sensing loop senses current flowing through the sensor.

6 Claims, 5 Drawing Sheets

(56)  References Cited

U.S. PATENT DOCUMENTS

2011/0026180 A1* 2/2011 Haible .................. H03H 11/46
                                                          327/344
2021/0325433 A1* 10/2021 Wu ........................ G01R 19/25
2022/0099706 A1* 3/2022 Bartlett ............... G01R 15/181

OTHER PUBLICATIONS

"Rogowski Coil", https://woodruffscientific.com/magnetic, Jan. 31, 2016.
"Rogowski Coil Probe", https://woodruffscientific.com/magnetic, Jan. 31, 2016.

* cited by examiner

10

METHOD AND APPARATUS FOR SENSING CURRENT

CROSS-REFERENCE TO RELATED APPLICATIONS

This application is a divisional application of U.S. patent application Ser. No. 17/968,156, entitled "Method and Apparatus for Sensing Current", which itself claims priority to and the benefit of the filing of U.S. Provisional Patent Application No. 63/256,919, entitled "Miniature Electrical Sensor for Hard-to-Reach Applications", filed on Oct. 18, 2021, and the specifications and claims, if any, thereof are incorporated herein by reference.

BACKGROUND OF THE INVENTION

Embodiments of the present invention relate to an apparatus and method for measuring current which can be particularly useful in hard-to-reach locations where existing current measuring methods cannot be used. Embodiments of the present invention can also provide desirable results for measuring the magnitude of current pulses in high-speed applications and/or in high vacuum environments.

Developers of power electronic devices must often remotely measure the current being transferred within the device. In some instances, the current pulse being measured is very short. Known sensors operate principally by wrapping a coil partially or fully around the conductor and sampling the magnetic field developed when a current pulse flows down the conductor. Often referred to as Rogowski coils, these types of sensors are common in many pulsed power designs where the sensor can be wrapped around conductors without direct electrical inclusion into the circuit. Though this method of operation is common, there are use cases where implementation of a Rogowski coil for current measurements is challenging and no current solution exists.

One particularly challenging application is using Rogowski coils in high vacuum applications. The typical coil design includes a number of insulated conductors that trap small quantities of air as a part of their fabrication. When these same sensors are used in vacuum applications, the small quantity of air entrained in the design slowly leaks into the vacuum volume and develops what is referred to as a "virtual leak." Virtual leaks can take hours, days or even weeks to bleed down to operational levels, and when the system is exposed to ambient conditions, the bleed down process must be repeated. Organizations, including Woodruff Scientific, do make Rogowski coils that are designed for high vacuum applications. Many applications require measuring the fields in very hard to reach locations; however, known sensors are not designed to accommodate such mounting locations.

A common theme in development of high-power solutions is the need to minimize size, weight, and power ("SWaP"). As solutions become smaller, it is necessary to make the same high-speed, high-current and high accuracy measurements in much smaller volumes. Though researchers have been able to develop exceedingly small Rogowski coils (for example some having a coil diameter of about 800 micrometers), it has required femtosecond laser micromachining techniques to successfully manufacture these units. Once etched, these small devices must be integrated into a housing that enables high vacuum, which offers numerous packaging challenges and is current limited. There is thus a present need for a sensor and method of fabrication which enables the use of readily available fabrication techniques-especially for a sensor and method of fabrication which can be manufactured at costs that are lower than currently-known current sensors and which are suitable for high vacuum applications.

BRIEF SUMMARY OF EMBODIMENTS OF THE PRESENT INVENTION

Embodiments of the present invention relate to a current sensor having a housing, the housing formed from an electrically conductive material; an output connector having an outer conductor, the outer conductor mechanically bonded to the housing; an inner conductor; and an insulator disposed between the outer conductor and the inner conductor; the current sensor also having a current sensing loop, the current sensing loop electrically coupled to the output connector and positioned to at least partially encircle at least a portion of the sensor. The current sensor can also include a housing standoff that is electrically coupled to the housing. Optionally, the current sensing loop can be positioned to at least partially encircle at least a portion of the housing standoff. An electrical insulator can be disposed between the current sensing loop and the housing standoff, which electrical insulator can optionally be selected to achieve a desired sensitivity of the current sensor.

In one embodiment, the outer conductor can be electrically coupled to the housing, or it can optionally be electrically insulated from the housing. The current sensing loop can be electrically coupled to the outer conductor of the output connector. In one embodiment, the current sensing loop can include a loop inner conductor, and a loop outer conductor—the loop outer conductor can be wrapped around and insulated from the loop inner conductor, except at a terminal end portion of the current sensing loop where the loop inner conductor and the loop outer conductor are electrically coupled together. The loop outer conductor can optionally be electrically coupled to the output connector. The loop inner conductor can be electrically coupled to the inner conductor. The output connector can optionally comprise a threaded output connector and/or a coaxial output connector. In one embodiment, the current sensing loop can encircle the standoff by at least about one full loop around the standoff and more preferably at least about 95% of one full loop around the standoff and more preferably at least about 99% of one full loop around the standoff.

Embodiments of the present invention also relate to a method for monitoring current flow into a vacuum chamber by allowing a flow of a drive current to travel along at least a portion of a component of a current sensor such that the current sensor forms a portion of a drive current circuit and such that the flow of the drive current is interrupted when the current sensor is removed. Optionally, allowing a flow of a drive current to travel along at least a portion of a component of a current sensor can include allowing at least 99% of a flow of a drive current to travel along at least a portion of a component of a current sensor. In the method, allowing a flow of a drive current to travel along at least a portion of a component of a current sensor can include allowing a flow of a drive current to travel along a housing of the current sensor, which can include a standoff of the current sensor. The method can also include sensing the drive current flowing through the current sensor by monitoring a voltage and/or a current generated in a current sensing loop that at least partially encircles at least a portion of the current sensor. The step of monitoring a voltage and/or a current generated in a current sensing loop can include monitoring a voltage and/or a current generated in a current sensing loop that at least partially encircles a housing standoff of the current sensor. The method can also include directing a flow of drive current through a conductor which also conducts a flow of electricity generated by a Rogowski coil.

Embodiments of the present invention relate to a sensor in a small integrated package that can be less than about 6 millimeters ("mm"), and which can include a housing that interfaces with a high current application to provide both a vacuum seal and a return path for high current. When installed, the sensor preferably provides both a mounting location and an isolated current path between isolated electronic devices and the system housing. A small toroidal current sensing loop, manufactured through readily available techniques, is preferably wrapped around the current path and measures the current through the conductor and transmits the signal through a small connector that is preferably installed in the base of the housing. Different embodiments of the sensor can optionally be provided and can be configured for: different mounting schemes to the housing and to the electronic device, different electrical characteristics including path voltage, path current and path frequency and different output configurations, which can include but is not limited to ground isolated and wireless transmission.

Objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE SEVERAL VIEWS OF THE DRAWINGS

The accompanying drawings, which are incorporated into and form a part of the specification, illustrate one or more embodiments of the present invention and, together with the description, serve to explain the principles of the invention. The drawings are only for the purpose of illustrating one or more embodiments of the invention and are not to be construed as limiting the invention. In the drawings.

DETAILED DESCRIPTION OF THE INVENTION

Embodiments of the present invention relate to a miniature electrical sensor that can measure rapid current pulses in hard-to-reach locations and in challenging environments, including vacuum environments.

Figure 1:
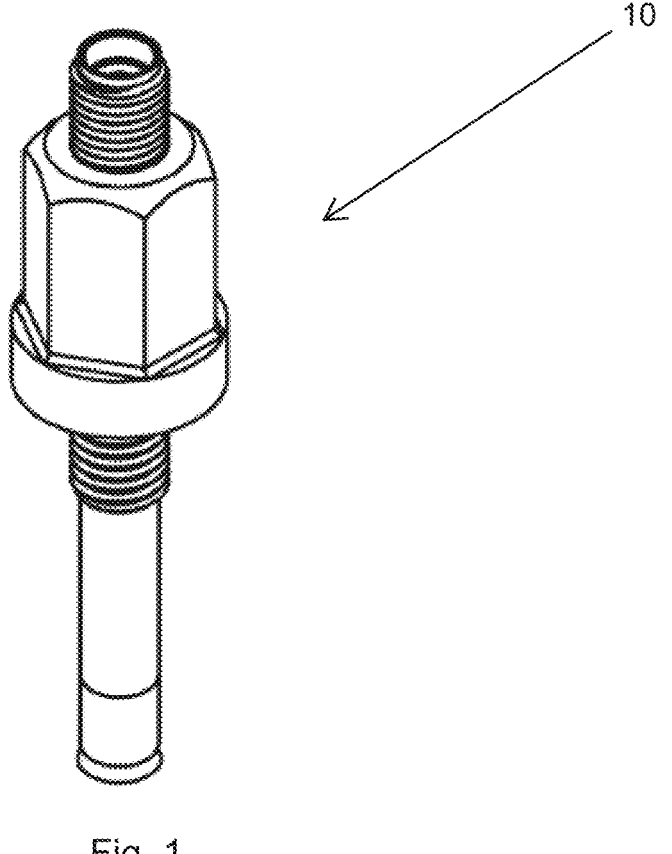
FIG. 1 is a drawing which illustrates an isometric view of a sub-miniature version A ("SMA") output connector that is threaded into a housing for reading current from a probe according to an embodiment of the present invention.
Figure 2:
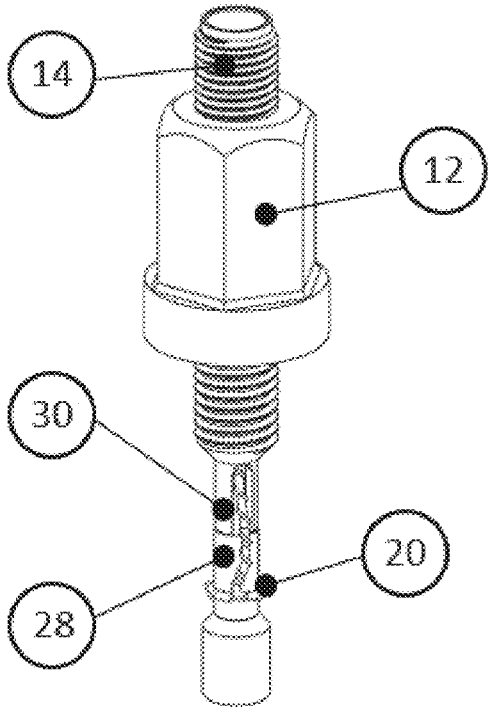
FIG. 2 is a drawing which illustrates a SMA threaded into a housing according to an embodiment of the present invention.
Figure 3:
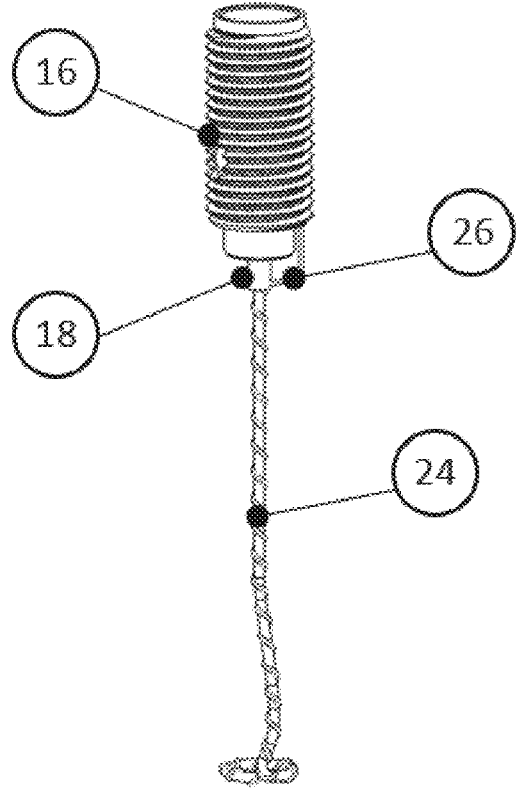
FIG. 3 is a drawing which illustrates a current sensing loop bonded to an output connector.

Referring now to the figures, sensor 10 preferably includes sensor housing 12, which is most preferably formed from a conductive material, output connector 14 for signal output. Output connector 14 is most preferably electrically coupled to sensor housing 12, most preferably via a bonding technique. Output connector 14 most preferably comprises threads, a diameter and other characteristics that match industry standards. However, output connector 14 can optionally comprise other shapes, sizes, and fitments. As best illustrated in FIGS. 2 and 3, output connector 14 preferably includes connector outer portion 16 and inner conductor 18 separated by insulator 19 (see FIG. 4). In one embodiment, connector outer portion 16 is preferably mechanically and electrically bonded to sensor housing 12. Bonding between connector outer portion 16 and sensor housing 12 can be accomplished by soldering, braze, threads, interference fit, or any other desired method, apparatus or system of connection. In another embodiment, connector outer portion 16 is preferably bonded to and electrically isolated from sensor housing 12.

Output connector 14 preferably includes current sensing loop 20, which develops an electrical response when current passes through housing standoff 22, which is most preferably formed from an electrically conductive material, and which is most preferably an end portion of sensor housing 12. Current sensing loop 20 preferably includes center conductor 24 and a helical conductor 26. Helical conductor 26 is preferably electrically coupled to center conductor 24 at the terminal end of current sensing loop 20. The other end of helical conductor 26 is preferably electrically coupled to connector outer portion 16 of output connector 14. Current sensing loop 20 is preferably electrically bonded to sensor housing 12 and sensor 10 is grounded when sensor housing 12 is inserted into a grounded structure or component. Optionally, however, connector outer portion 16 can be electrically isolated from sensor housing 12 such that the current sensing loop 20 remains isolated from sensor housing 12 and can be unbonded. In one embodiment, helical conductor 26 can comprise a single continuous piece of material which also forms center conductor 24, thus negating the necessity of coupling the two conductors at a terminal portion thereof. In one embodiment, after helical conductor 26 is wrapped around center conductor 24 and electrically coupled thereto at a terminal end portion thereof, the thus-constructed pigtail of center conductor 24 and helical conductor 26 is then preferably wrapped around the desired portion of sensor 10 such that a loop or at least substantially a loop is formed, thus creating current sensing loop 20.

Center conductor 24 is most preferably covered, at least partially in an electrically insulative material. Helical conductor 26 is also most preferably at least partially covered with an electrically insulative material. The diameter and insulation thickness of center conductor 24 can be varied to change sensitivity and voltage hold-off of current sensing loop 20. The diameter, insulation thickness and pitch of the helical conductor 26 can also be varied to change sensitivity and voltage hold-off of the current sensing loop 20. The inner conductor 18 of output connector 14 is preferably bonded to center conductor 24 of the current sensing loop 20 and electrical and/or mechanical coupling is preferably achieved by bonding, which itself can include brazing, soldering or any other desired method which provides an electrical and/or mechanical connection. Connector outer portion 16 is coupled, most preferably via a bonding technique, to helical conductor 26, which bonding can optionally include but is not limited to brazing, soldering or another electrically conductive connection method or apparatus.

Prior to assembly, electrical insulation 28 is preferably applied to housing standoff 22. Although electrical insulation 28 can be provided in any form, in one embodiment, electrical insulation 28 is preferably a tape. In addition to providing electrical isolation, electrical insulation 28 increases the gap between housing standoff 22 and current sensing loop 20 to adjust sensitivity and improve signal to noise ratio. During assembly, current sensing loop 20 is preferably passed through the center of sensor housing 12 and out through opening 30 located in the side of housing standoff 22 (see FIG. 2). Output connector 14 is preferably fully inserted and bonded into its final location. The terminal end portion of sensing loop 20 is preferably wrapped around housing standoff 22 for at least one turn. Optionally, more than one turn can be used to achieve a desired sensitivity of sensor 10. The length of current sensing loop 20 can be pre-sized or cut to length to achieve a desired sensitivity range. Center conductor 24 and helical conductor 26 of current sensing loop 20 are preferably stripped back and bonded together by braze, solder or other conductive apparatus or method to achieve electrical connectivity. The bonded end of the current sensing loop 20 is preferably electrically insulated from housing standoff 22. Once wrapped, current sensing loop 20 can optionally be mechanically bonded with adhesive or another method or apparatus to ensure a tight wrap against electrical insulation 28. Once this assembly is complete, sensor 10 is preferably threaded into a mold form and the remaining volume between the output connector 14, sensor housing 12 and the mold is filled with encapsulant 32 which permanently holds current sensing loop 20 in place and prevents any form of leak through the sensor housing 12. Encapsulant 32 can optionally have any desired properties, including but not limited to: melting point, durometer, elongation, potting life, vacuum level and electrical field strength. The body of the sensor housing 12 preferably includes threads or some other structure, method, or apparatus for attaching sensor 10 to the experiment or other structure with which it is to be used. For example, as illustrated best in FIG. 4, threads can be formed onto an exterior of a lower portion of sensor housing 12. Finally, current connector 34 is preferably provided for mechanically and electrically bonding an experimental or other current source to the sensor 10.

Figure 4:
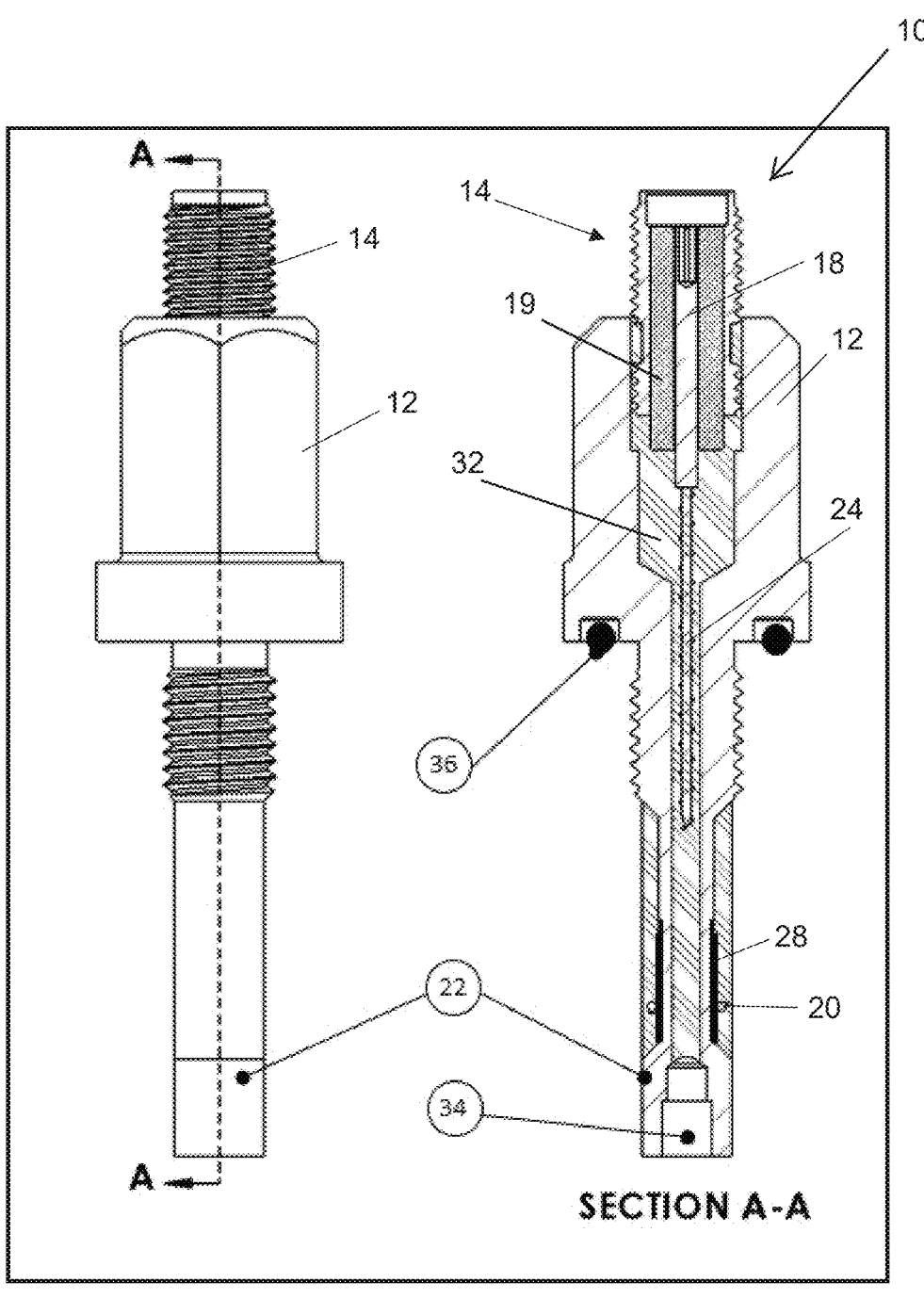
FIG. 4 is a drawing which illustrates an elevation and a section view of an SMA connector threaded into a housing according to an embodiment of the present invention.

As best illustrated in FIG. 4, seal 36 is preferably provided to enable use in vacuum and other environments. In one embodiment, sensor housing 12 of sensor 10 preferably includes threads to firmly attached the sensor 10 to a mechanical interface of the device to which sensor 10 is to be attached. Alternate embodiments of sensor 10 can include other methods for sealing- or optionally not providing a seal at all. Sensor housing 12 can optionally be attached via any desired method or apparatus, including but not limited to bosses or other physical structures to mechanically attach sensor 10. Other embodiments can include electrical isolation of sensor housing 12 to enable floating electrical measurements. Other embodiments can also include articulated or telescoping housing standoffs 22 and/or wireless output.

In one embodiment, current sensing loop 20 can be permanently integrated around housing standoff 22—for example by use of encapsulant 32, which enables use of sensor 10 in space-constrained vacuum applications.

Optionally, however, sensor loop 20 can be a removable loop that is not configured for high vacuum applications in constrained spaces.

In one embodiment, sensor 10 is preferably configured to be threaded into an opening in an assembly where a flow of current is to be measured through sensor 10. A threaded connection at the tip or other location on sensor 10 can optionally include a method or apparatus that allows for mounting a wire or electron collector. When the wire or collector, as part of its function, sees a rapid change in current, the flow of current preferably passes through the housing standoff 22 of sensor 10. Current sensing loop 20, which can include, for example, a variation of a Rogowski coil, is preferably wrapped around the housing standoff 22 and senses the magnetic flux generated from the flowing current. The output from current sensing loop 20, is passed out of the sensor 10 to an integrator to convert the signal to a time-based voltage output. In one embodiment, the output of current sensing loop 20 is preferably calibrated to provide a calibration factor as is further described later in this application.

In one embodiment, to use sensor 10, a user threads (or otherwise attaches) sensor 10 into the item to which sensor 10 is to be attached—for example a base housing of a device. While the base housing is partially assembled, the user can attach a wire or collector to the tip of sensor 10 to enable measurement of current flow from sensor 10 to the base housing. The user most preferably attaches a wire, which can include a coaxial cable, to output connector 14 of sensor 10 (which itself can include, for example, a subminiature version A ("SMA" connector)) and passes the signal to an appropriate integrator circuit or other device. With a calibration value for sensor 10, a user can view a time-based profile of the current passing through sensor 10.

In one embodiment, sensor 10 can be constructed using the following steps:

1) Machine sensor housing 12;
2) Wrap current sensing loop 20;
3) Integrate or otherwise dispose current sensing loop 20 into sensor housing 12;
4) Encapsulate 32 the assembly; and
5) Calibrate the completed sensor 10.

Sensor housing 12 can be machined from a variety of conductive materials. However, in one embodiment, stainless steel is preferably used. Standard mill and lathe operations can be used to create the geometry of sensor housing 12 and laser etching can optionally be used to label and serialize sensor 10 for calibration traceability.

To form current sensing loop 20, consistent spacing of helical conductor 26 is preferably provided. For this embodiment, a fabrication device is used to maintain a consistent pitch as the helical conductor 26 is wrapped around center conductor 24. Current sensing loop 20 is clipped from the fabrication device such that one end is close-cut and the other end provides significant unwrapped portions of the two conductors. The close-cut end is preferably cleaned and soldered together to complete an electrical circuit and the unwrapped end is preferably stripped for the next phase of fabrication. The fabricator then preferably checks to ensure continuity of the two conductors.

Current sensing loop 20, fabricated in the previous step, is preferably electrically bonded or otherwise connected to output connector 14 and adhesive can optionally be applied at the location of the connection between output connector 14 and helical conductor 26 to protect helical conductor 26 during installation. The continuity of current sensing loop 20 through output connector 14 is preferably verified.

In one embodiment, sensor housing 12 is preferably machined or otherwise formed and is then preferably thoroughly cleaned to improve adhesion of electrical insultation 28 and the encapsulant 32. In one embodiment, a small strip of polyimide tape, wide enough to fit the width of the tape groove, is wrapped around housing standoff 22—most preferably at the location illustrated on FIG. 4, until the full depth of the groove in that portion of housing standoff 22 is filled with insulation (which in one embodiment is most preferably a depth of about 0.005 inches to about 0.025 inches and most preferably about 0.01 inches). Then, a small bead, which is preferably formed from a plastic material, is preferably inserted in current connector 34, which is preferably an end portion of housing standoff 22, via a fastener to prevent encapsulant 32 from filling mounting threads which are most preferably provided on an internal surface of current connector 34.

Output connector 14, with attached current sensing loop 20 is preferably threaded or otherwise disposed into sensor housing 12 with the end of current sensing loop 20 passing through opening 30 in the side of housing standoff 22. The loose end of current sensing loop 20 is then wrapped one or more times around the center conductor 24 and adhesive is preferably used to mechanically bond current sensing loop 20 firmly to electrical insulation 28.

Sensor 10 is preferably threaded or otherwise disposed into a mold which includes a port to inject encapsulant 32 into the volume being encapsulated. Because encapsulant 32 is preferably injected under pressure, the liquid material displaces the air from inside sensor 10 to fill the volume needing encapsulation. When encapsulant 32 has cured, the thus-encapsulated sensor 10 is removed from the mold with the coil no longer visible due to coverage from the encapsulant 32. A final continuity check is preferably performed to ensure the encapsulation process did not break a coil wire.

The new constructed sensor 10 is preferably connected to a high-speed capacitive discharge circuit where the output of current sensing loop 20 is integrated and compared to the output from a current-viewing resistor. This comparison results in a calibration factor which is documented for that particular serial number sensor 10.

In one embodiment, sensor housing 12 is most preferably a conductive structure that provides a way for attaching an electrical input to sensor 10, as well as an electrical output thereof and also preferably provides a pressure barrier for embodiments which are capable of being used in pressurized or vacuum chamber environments. In one embodiment, housing standoff 22 is preferably a portion of sensor housing 12 which is hollow and which carries the current being measured and which provides a way for attaching sensor 10 to another device or system where current is to be measured. In one embodiment, output connector 14 is preferably an electrical connector that allows connection between the output of current sensing loop 20 and the integrator. In one embodiment, current sensing loop 20 is preferably formed from insulated conductors fabricated in a helix and bonded to maintain its geometric shape. When wrapped around the housing standoff, current sensing loop 20 registers an electrical signal by induction as current passes down housing standoff 22. In one embodiment, encapsulant 32 is preferably injectable material, that can include for example, but is not limited to a potting compound, and it most preferably provides electrical, environmental, and/or pressure barrier in and around sensor housing 12 of sensor 10. In one embodiment, sensor 10 can be connected to an integrator, which itself can include any device taking the electrical signal from sensor 10 and converting it to a time-based measurement of current. In one embodiment, the integrator is not a part of the present invention. In one embodiment, current collector can be a connection of the device or system to which sensor 10 is connected and can optionally be threaded or include another connection system maintaining a pressure differential for which the device being interrogated is designed.

INDUSTRIAL APPLICABILITY

The invention is further illustrated by the following non-limiting example.

Example 1

Figure 5:
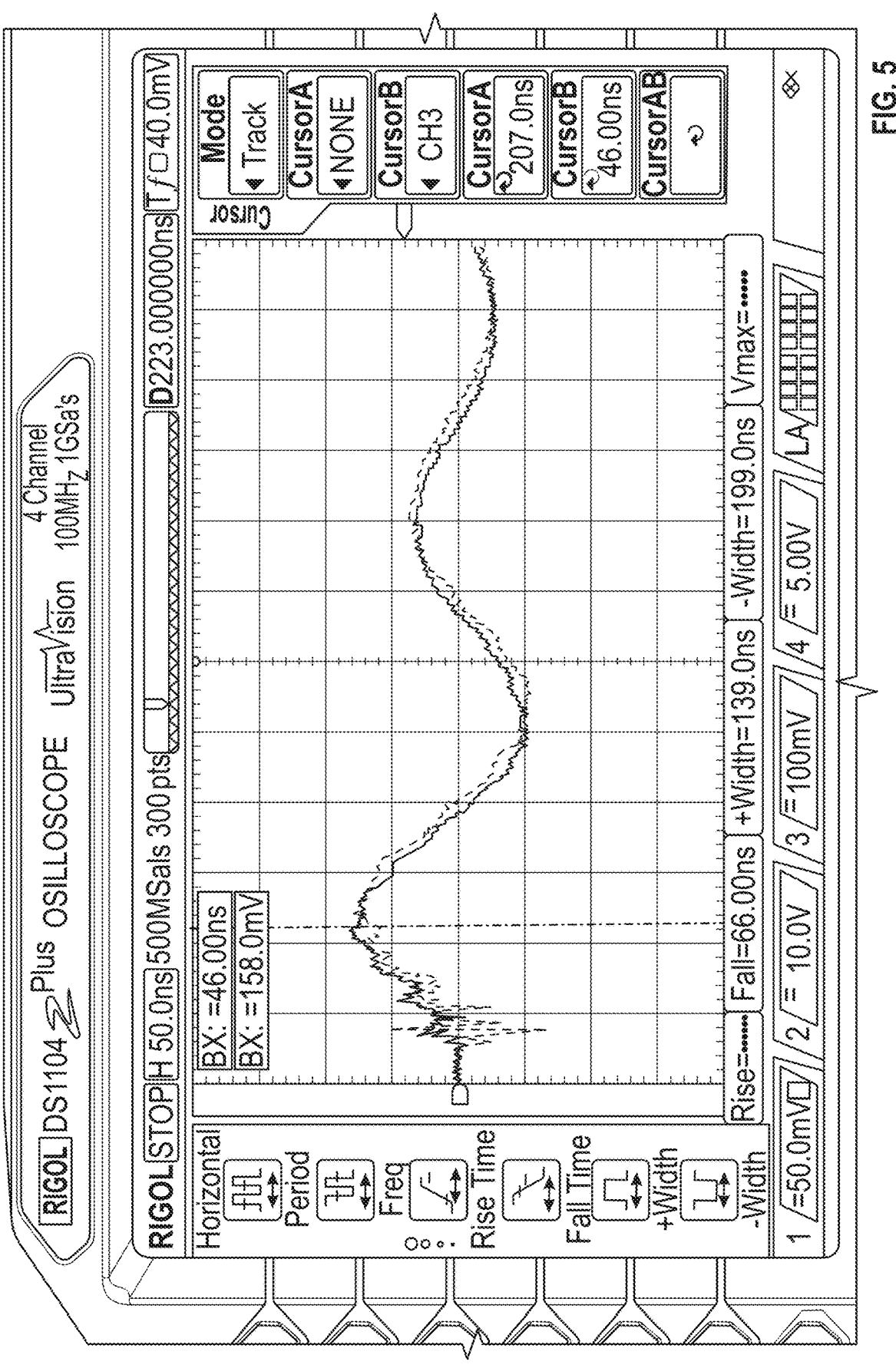
FIG. 5 is a drawing which illustrates the results of a comparison between an output of a sensor according to an embodiment of the present invention and a current viewing resistor, wherein both are measuring time-based current output from a capacitive discharge circuit.

A sensor according to an embodiment of the present invention was constructed and calibrated against a precision current viewing resistor ("CVR") using a fast rise capacitive discharge circuit. The calibration process indicated the sensor was capable of reproducing single-digit nanosecond rise times and could reproduce the current viewing resistor current signal within a few percent. A trace comparing the output of the CVR, and the invention was taken and is shown in FIG. 5. That same prototype was integrated into a vacuum system via a ¼ inch, 28 threads per inch threaded hole and was found to hold a vacuum to a leak rate too low to be measured.

The preceding example can be repeated with similar success by substituting the generically or specifically described components and/or operating conditions of embodiments of the present invention for those used in the preceding example.

Note that in the specification and claims, "about", "approximately", and/or "substantially" means within twenty percent (20%) of the amount, value, or condition given. The term "drive current" is occasionally used herein to refer to the current that is being sensed.

Embodiments of the present invention can include every combination of features that are disclosed herein independently from each other. Although the invention has been described in detail with particular reference to the disclosed embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above are hereby incorporated by reference. Unless specifically stated as being "essential" above, none of the various components or the interrelationship thereof are essential to the operation of the invention. Rather, desirable results can be achieved by substituting various components and/or reconfiguring their relationships with one another.

What is claimed is:

1. A method for monitoring current flow into a pressurized or vacuum chamber by:
   allowing a flow of a drive current to travel along at least a portion of a component of a current sensor such that the current sensor forms a portion of a drive current circuit and such that the flow of the drive current is interrupted when the current sensor is removed;
   sensing the drive current flowing through the current sensor by monitoring a voltage and/or a current generated in a current sensing loop that is wrapped at least one time around at least a portion of the current sensor.

2. The method of claim 1 wherein allowing a flow of a drive current to travel along at least a portion of a component of a current sensor comprises allowing at least 99% of a flow of a drive current to travel along at least a portion of a component of a current sensor.

3. The method of claim 1 wherein allowing a flow of a drive current to travel along at least a portion of a component of a current sensor comprises allowing a flow of a drive current to travel along a housing of the current sensor.

4. The method of claim 3 wherein allowing a flow of a drive current to travel along at least a portion of a component of a current sensor comprises allowing a flow of a drive current to travel along the housing of the current sensor and along a housing standoff of the current sensor.

5. The method of claim 1 wherein monitoring a voltage and/or a current generated in a current sensing loop comprises monitoring a voltage and/or a current generated in a current sensing loop that at least partially encircles a housing standoff of the current sensor.

6. The method of claim 1 further comprising directing a flow of drive current through a conductor which also conducts a flow of electricity generated by a Rogowski coil.

* * * * *